United States Patent
Wang et al.

(10) Patent No.: US 11,855,388 B2
(45) Date of Patent: Dec. 26, 2023

(54) FLOATING ELECTRICAL CONNECTOR

(71) Applicant: ALPHA NETWORKS INC., Hsinchu (TW)

(72) Inventors: Chih-Kuang Wang, Hsinchu (TW); Ying-Chieh Shih, Hsinchu (TW); I-Feng Lo, Hsinchu (TW); Chin-Chih Chuang, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 141 days.

(21) Appl. No.: 17/693,741

(22) Filed: Mar. 14, 2022

(65) Prior Publication Data

US 2023/0071615 A1 Mar. 9, 2023

(30) Foreign Application Priority Data

Sep. 7, 2021 (TW) .................................. 110133254

(51) Int. Cl.
*H01R 13/631* (2006.01)
*H01R 12/57* (2011.01)
(Continued)

(52) U.S. Cl.
CPC ......... *H01R 13/6315* (2013.01); *H01R 12/57* (2013.01); *H01R 12/70* (2013.01); *H01R 13/187* (2013.01)

(58) Field of Classification Search
CPC ............ H05K 2201/1031; H01R 12/57; H01R 12/70; H01R 12/714; H01R 12/716;
(Continued)

(56) References Cited

U.S. PATENT DOCUMENTS 5,201,663 A * 4/1993 Kikuchi ............. H01R 13/6315
439/82
5,516,303 A * 5/1996 Yohn .................. H01R 13/6315
439/248

(Continued)

FOREIGN PATENT DOCUMENTS

TW 201613206 A 4/2016

OTHER PUBLICATIONS

WO-2020179348-A1 with translation (Year: 2020).*
Taiwanese Search Report for Taiwanese Application No. 110133254, dated Feb. 2, 2023, with English translation.

*Primary Examiner* — Marcus E Harcum
(74) *Attorney, Agent, or Firm* — Birch, Stewart, Kolasch & Birch, LLP (57) ABSTRACT

A floating electrical connector includes a housing with a tubular portion. An axis is defined in a center of the tubular portion. Several floating terminals are arranged around the axis and are partially connected. Each floating terminal has an inner terminal sheet on an inner side and a spring structure on an outer side. Each spring structure is connected to one of the inner terminal sheets. A portion of the inner terminal sheet is inserted into the tubular portion and arranged along an inner peripheral surface of the tubular portion. The portion of each inner terminal sheet located in the tubular portion has an electronic contact bulging inward. Several external pins are electrically connected around the floating terminals. When a conductive pin is inserted into the tubular portion, the spring structures could elastically deform, allowing the tubular portion to adapt to a horizontal deviation or a skew deviation of the conductive pin, providing a greater tolerance for alignment deviations.

14 Claims, 10 Drawing Sheets

(51) Int. Cl.
*H01R 12/70* (2011.01)
*H01R 13/187* (2006.01)

(58) Field of Classification Search
CPC .. H01R 12/91; H01R 13/6315; H01R 13/111; H01R 13/187
USPC .................................................... 439/74, 248
See application file for complete search history.

(56) References Cited

U.S. PATENT DOCUMENTS

| | | | |
|---|---|---|---|
| 5,769,652 A * | 6/1998 | Wider | H01R 24/50 439/63 |
| 9,039,433 B2 * | 5/2015 | Barthelmes | H01R 24/542 439/248 |
| 10,374,346 B2 * | 8/2019 | Doi | H01R 13/6315 |
| 10,892,576 B2 | 1/2021 | Lu et al. | |
| 11,664,617 B2 * | 5/2023 | Li | H01R 43/16 439/743 |
| 2018/0287301 A1 | 10/2018 | Tanaka et al. | |
| 2020/0153137 A1 * | 5/2020 | Nogawa | H01R 12/73 |
| 2020/0169040 A1 * | 5/2020 | Sakaue | H01R 13/41 |
| 2020/0313355 A1 * | 10/2020 | Bronk | H01R 13/502 |
| 2021/0098916 A1 | 4/2021 | Lu et al. | |
| 2021/0111517 A1 * | 4/2021 | Tamaki | H01R 43/16 |
| 2021/0313746 A1 * | 10/2021 | Kato | H01R 13/6215 |
| 2022/0173536 A1 * | 6/2022 | Kitagawa | H01R 12/707 |
| 2022/0328994 A1 * | 10/2022 | Komoto | H01R 12/716 |
| 2022/0344846 A1 * | 10/2022 | Kitagawa | H01R 12/89 |
| 2023/0170636 A1 * | 6/2023 | Zhang | H01R 13/111 439/248 |

* cited by examiner

FLOATING ELECTRICAL CONNECTOR

BACKGROUND OF THE INVENTION

Technical Field

The present invention relates generally to an electrical connector, and more particularly to a floating electrical connector and a circuit connecting structure.

Description of Related Art

Conventional electrical connectors, such as an electrical connector disclosed in U.S. patent No. U.S. Ser. No. 10/892,576, are provided with a contact spring with a relatively constricted central shape inside a tubular housing, wherein the contact spring can elastically deform to be in contact with an inserted conductive pin, thereby electrically connecting two circuit boards that are respectively engaged with the electrical connector and the conductive pin.

Since the contact spring could slightly deform laterally, the aforementioned electrical connector could adapt to a slightly horizontal deviation when the conductive pin is inserted. However, since two ends of the contact spring are fixed, a deformable range is small, so that the conductive pin might be unable to be inserted into the electrical connector when the conductive pin is inserted in a large horizontal deviation or in a skew deviation. Even forcibly inserting the conductive pin, the contact spring may permanently deform, which reduces a contact area between the conductive pin and the contact spring. causing a blackout problem when a large current passes through the electrical connector and exceeds a load of the electrical connector.

BRIEF SUMMARY OF THE INVENTION

In view of the above, the primary objective of the present invention is to provide a floating electrical connector and a circuit connecting structure provided with the floating electrical connector, wherein a surrounding spring structure could absorb an aligning horizontal deviation and an aligning skew deviation between the electrical connector and the conductive pin, thereby the electrical connector could absorb tolerances well and has a greater tolerance for alignment deviations.

The present invention provides a floating electrical connector, including a housing and a conductive member, wherein the housing has a tubular portion. An axis is defined in a center of the tubular portion. The conductive member includes a plurality of floating terminals and a plurality of external pins, wherein the floating terminals are arranged at intervals around the axis and are partially connected. Each of the floating terminals has an inner terminal sheet on an inner side and a spring structure on an outer side. Each of the spring structures is connected to one of the inner terminal sheets. At least a portion of the inner terminal sheet is inserted into the tubular portion and arranged along an inner peripheral surface of the tubular portion. The portion of each of the inner terminal sheets located in the tubular portion has an electronic contact bulging inward. The external pins are electrically connected to the floating terminals.

The present invention further provides a circuit connecting structure, including a first circuit structure, a floating electrical connector, and a second circuit structure, wherein the first circuit structure has a first circuit board having a through hole. The external pins of the floating electrical connector are electrically connected to a portion of the first circuit board around the through hole, and the axis passes through a center of the through hole. The second circuit structure has a second circuit board, wherein the second circuit board is electrically engaged with a conductive pin. The conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

With the aforementioned design, the conductive member of the floating electrical connector has the surrounding spring structures, wherein the spring structures elastic deforms with the compression of the spring structures on a side and the expansion of the spring structures on the other side. In this way, when the conductive pin is inserted into the tubular portion to be in contact with the electronic contact of the inner terminal sheet around the inner peripheral surface of the tubular portion, the elastic deformation of the spring structures could absorb the horizontal deviation or the skew deviation when the conductive pin has a horizontal deviation or a skew deviation, providing a better electrical connection and achieving a function of absorbing tolerances well and having a greater tolerance for alignment deviations.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

A floating electrical connector 100 according to an embodiment of the present invention is illustrated in FIG. 1 to FIG. 5, which is adapted to be inserted by a conductive pin 207 and to build an electrical connection between circuit structures, and includes a housing 10 and a conductive member 20 that is got into and positioned in the housing 10.

The housing 10 is made of an insulating material and has a tubular portion 12, wherein an axis A is defined in an axle center of the tubular portion 12.

The conductive member 20 is a conductor made of metal and includes a plurality of floating terminals 22 and a plurality of external pins 24 in a pad form, wherein the floating terminals 22 are arranged at intervals around the axis A and are partially connected. Each of the floating terminals 22 has an inner terminal sheet 221 on an inner side and a spring structure 225 on an outer side, wherein the spring structure 225 is connected to the inner terminal sheet 221. At least a portion of the inner terminal sheets 221 is inserted into the tubular portion 12 and arranged along an inner peripheral surface of the tubular portion 12, wherein the portion of each of the inner terminal sheets 221 located in the tubular portion 12 has an electronic contact 222 bulging inward. The external pins 24 are connected to an outer portion of the spring structures 225, thereby electrically connected to the floating terminals 22.

Figure 1:
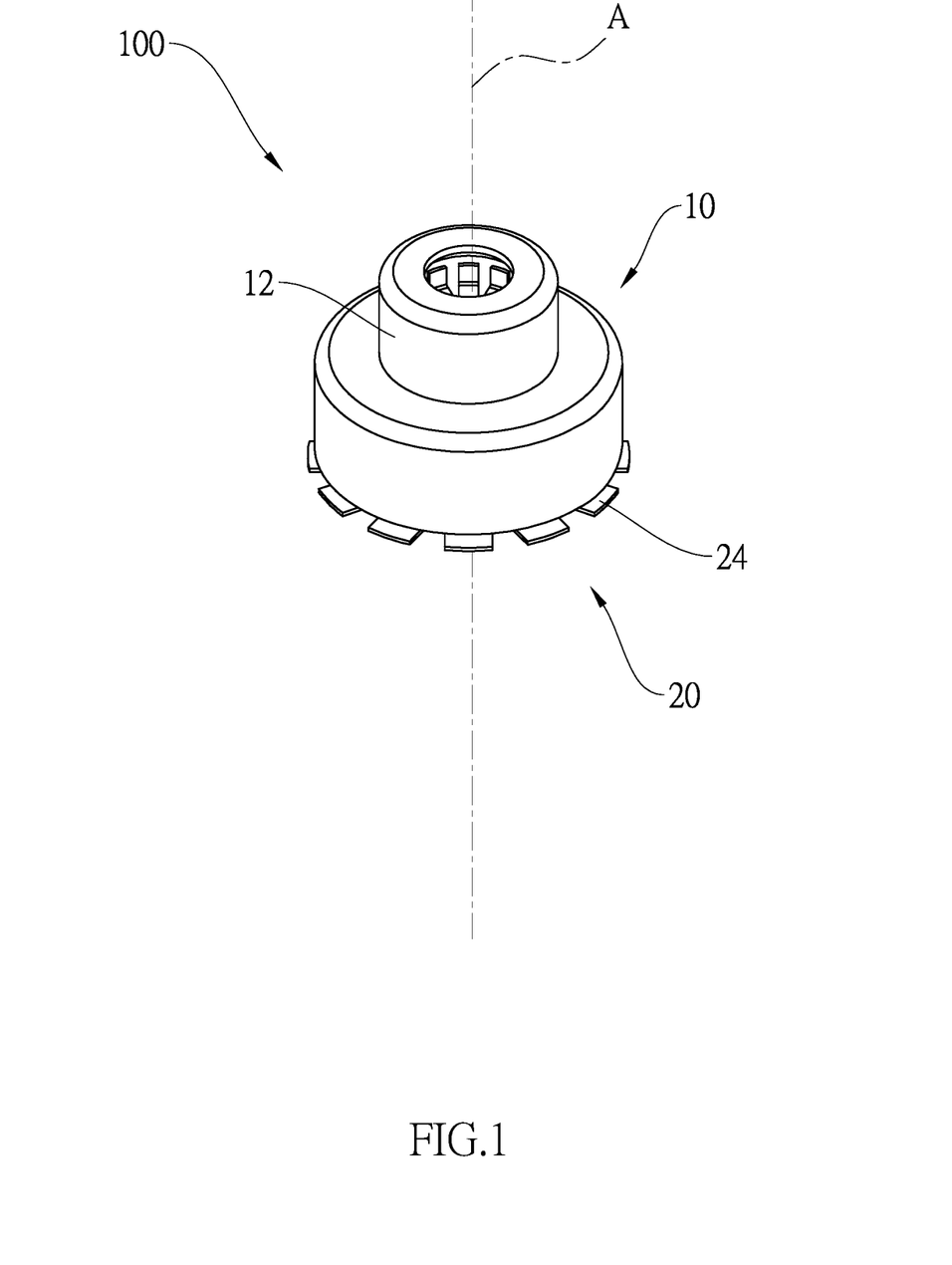
FIG. 1 is a perspective view of the floating electrical connector according to an embodiment of the present invention.
Figure 2:
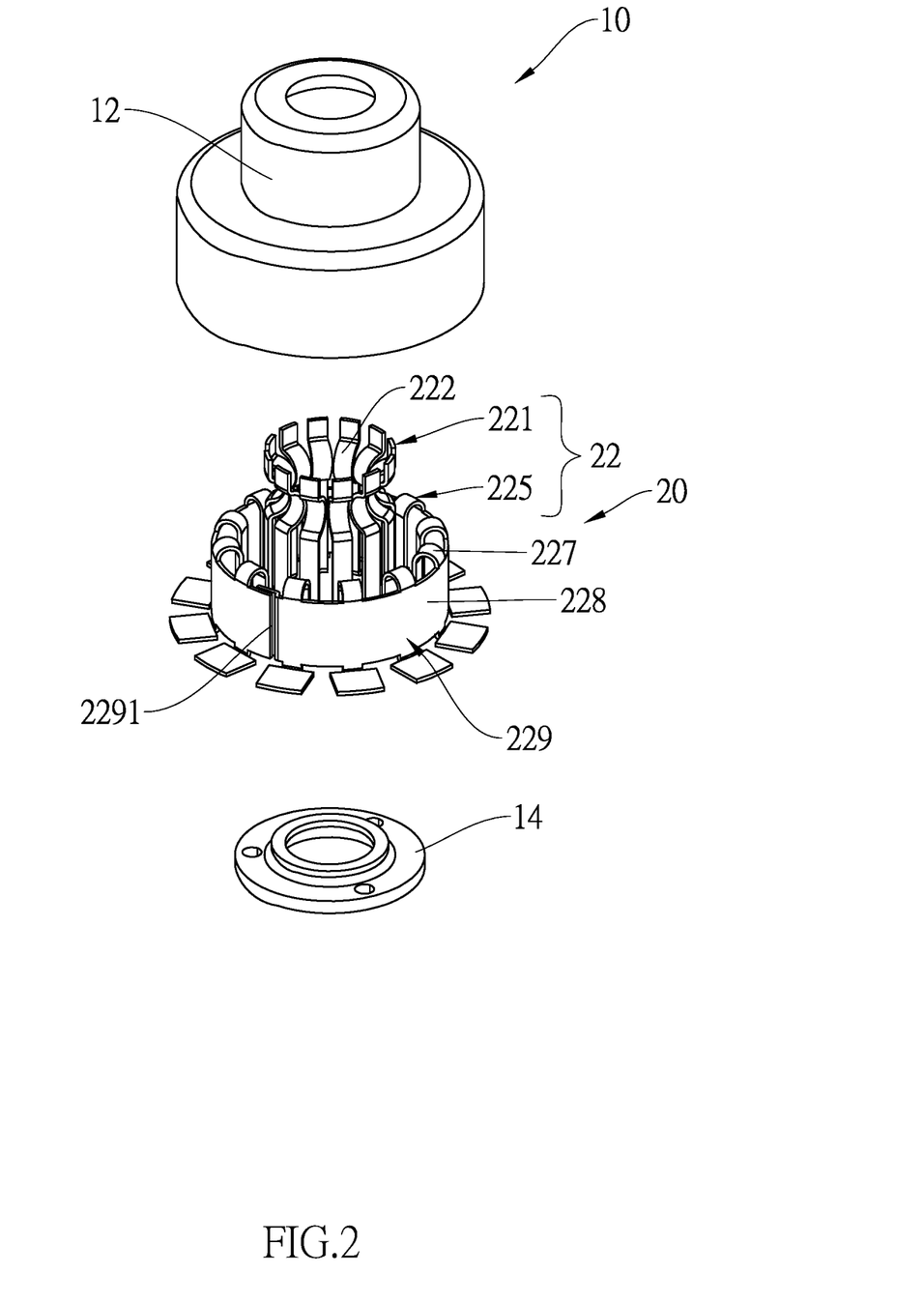
FIG. 2 is an exploded view of the floating electrical connector according to the embodiment of the present invention.
Figure 3:
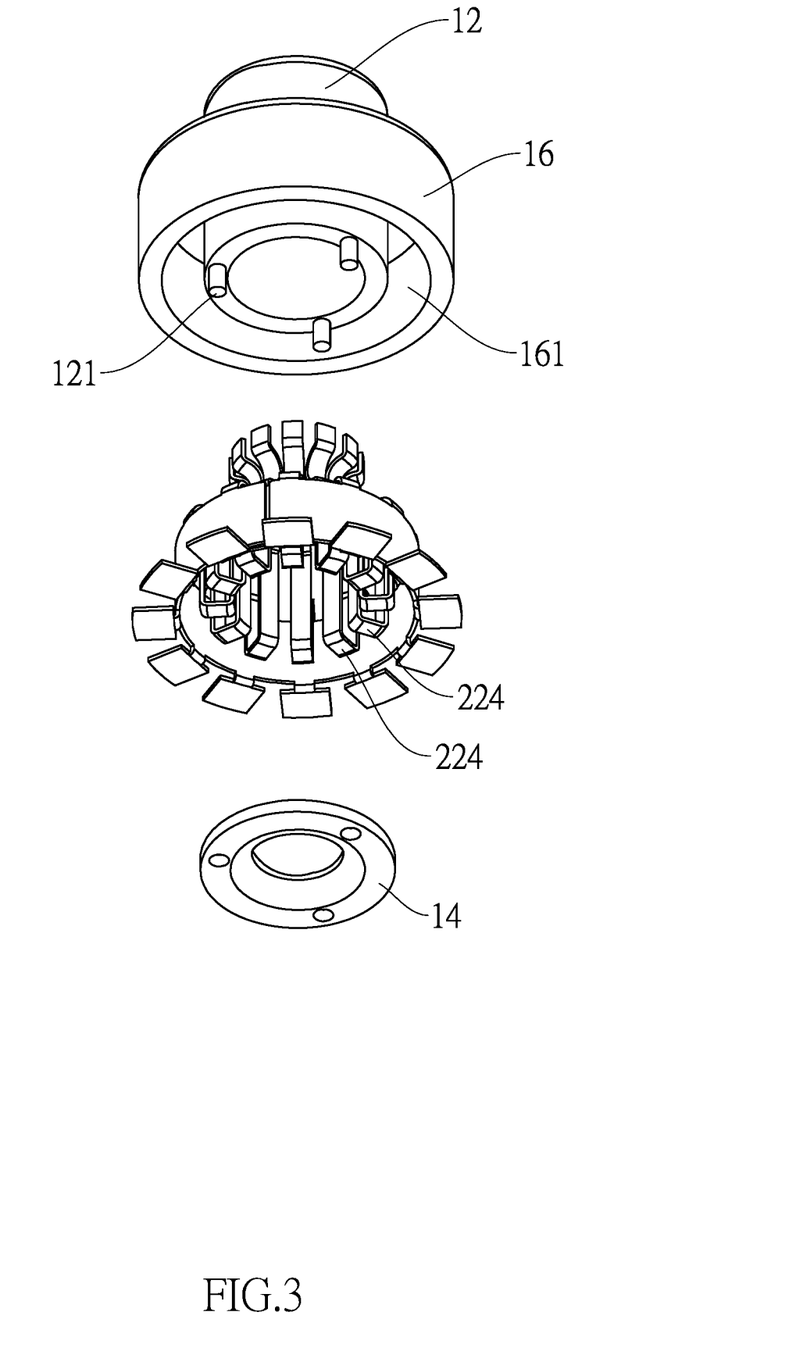
FIG. 3 is an exploded view of the floating electrical connector according to the embodiment of the present invention seen from another direction.
Figure 4:
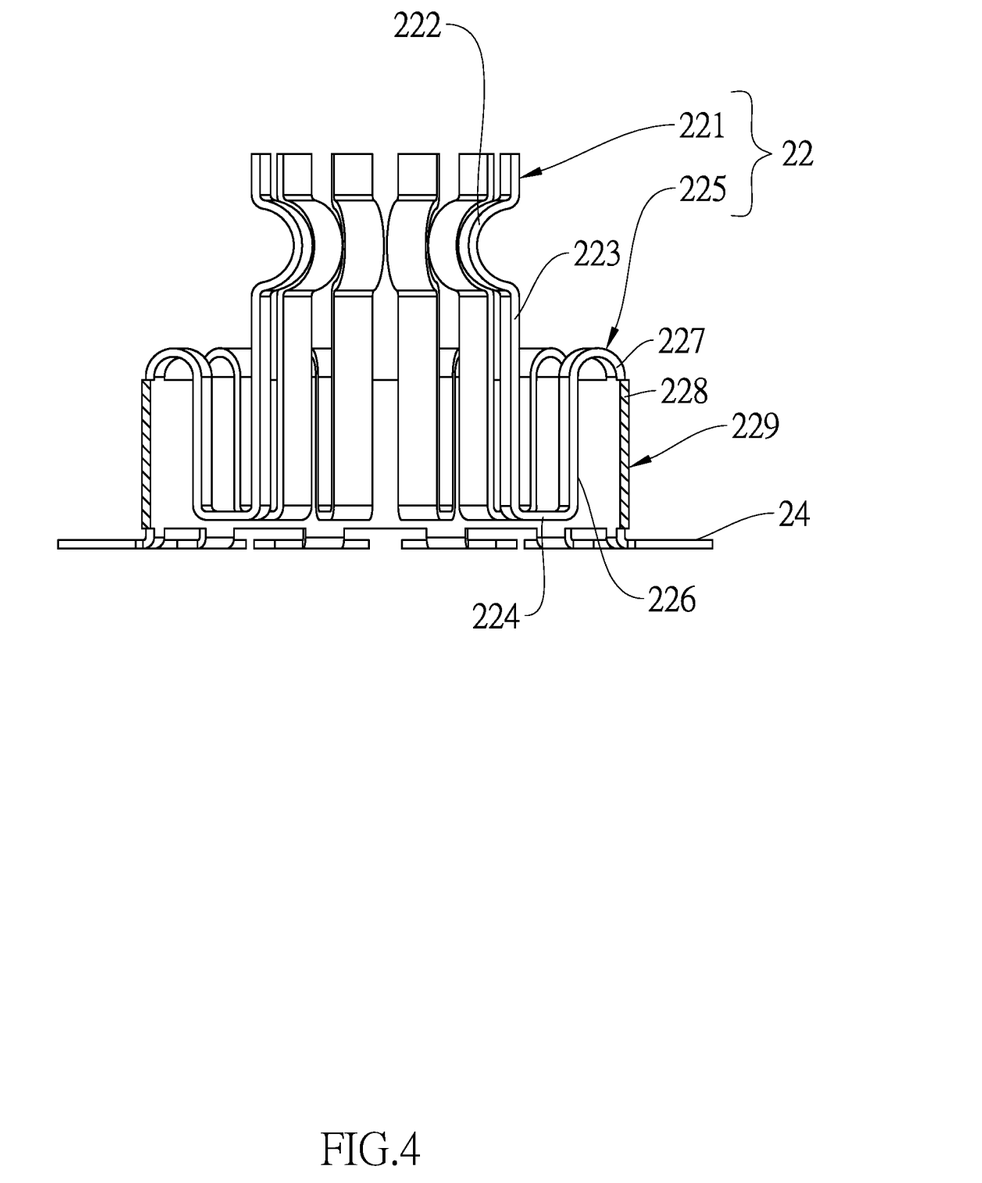
FIG. 4 is a sectional view, showing the conductive member according to the embodiment of the present invention.
Figure 5:
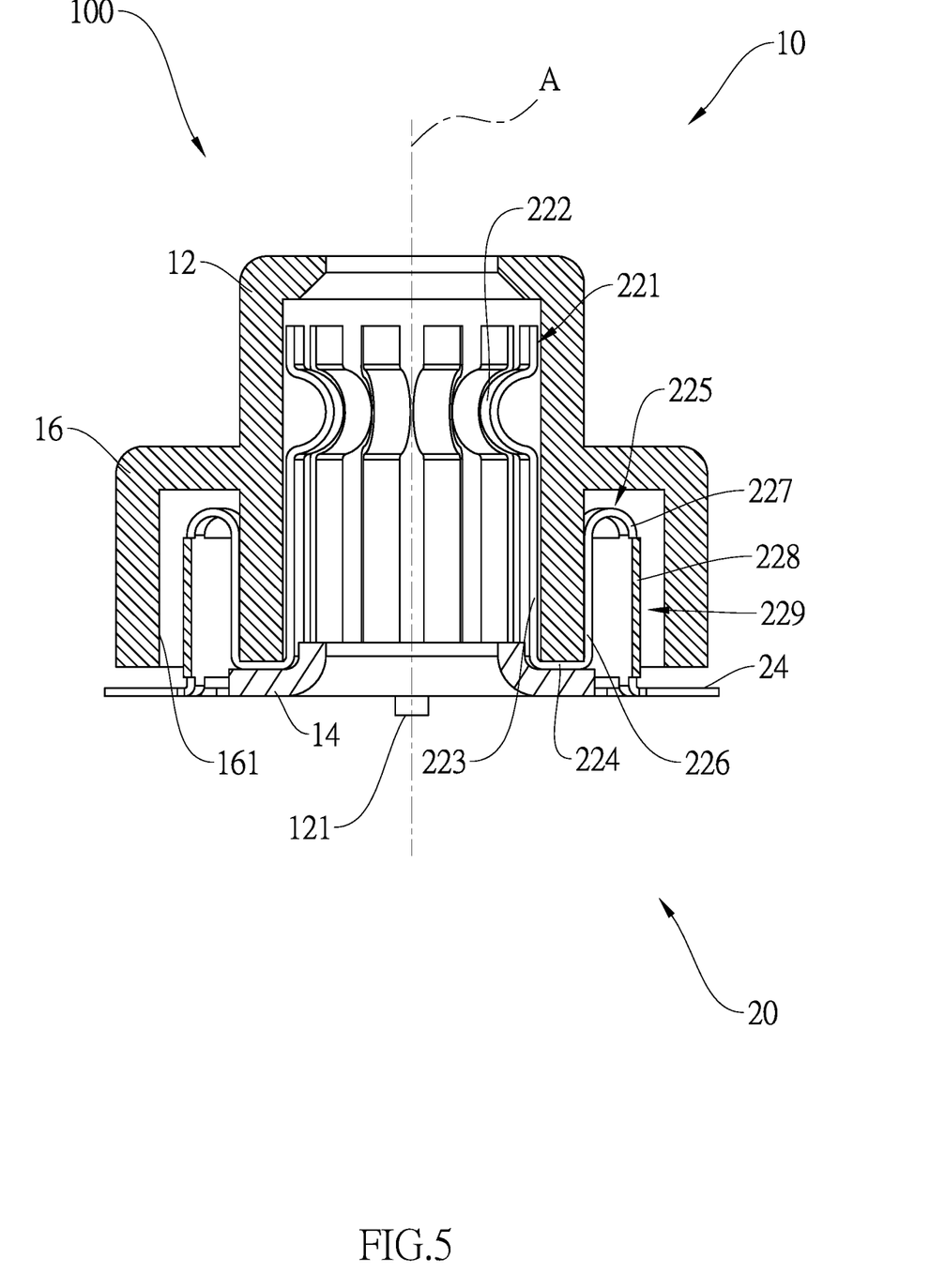
FIG. 5 is a sectional view, showing the floating electrical connector according to the embodiment of the present invention.
Figure 6:
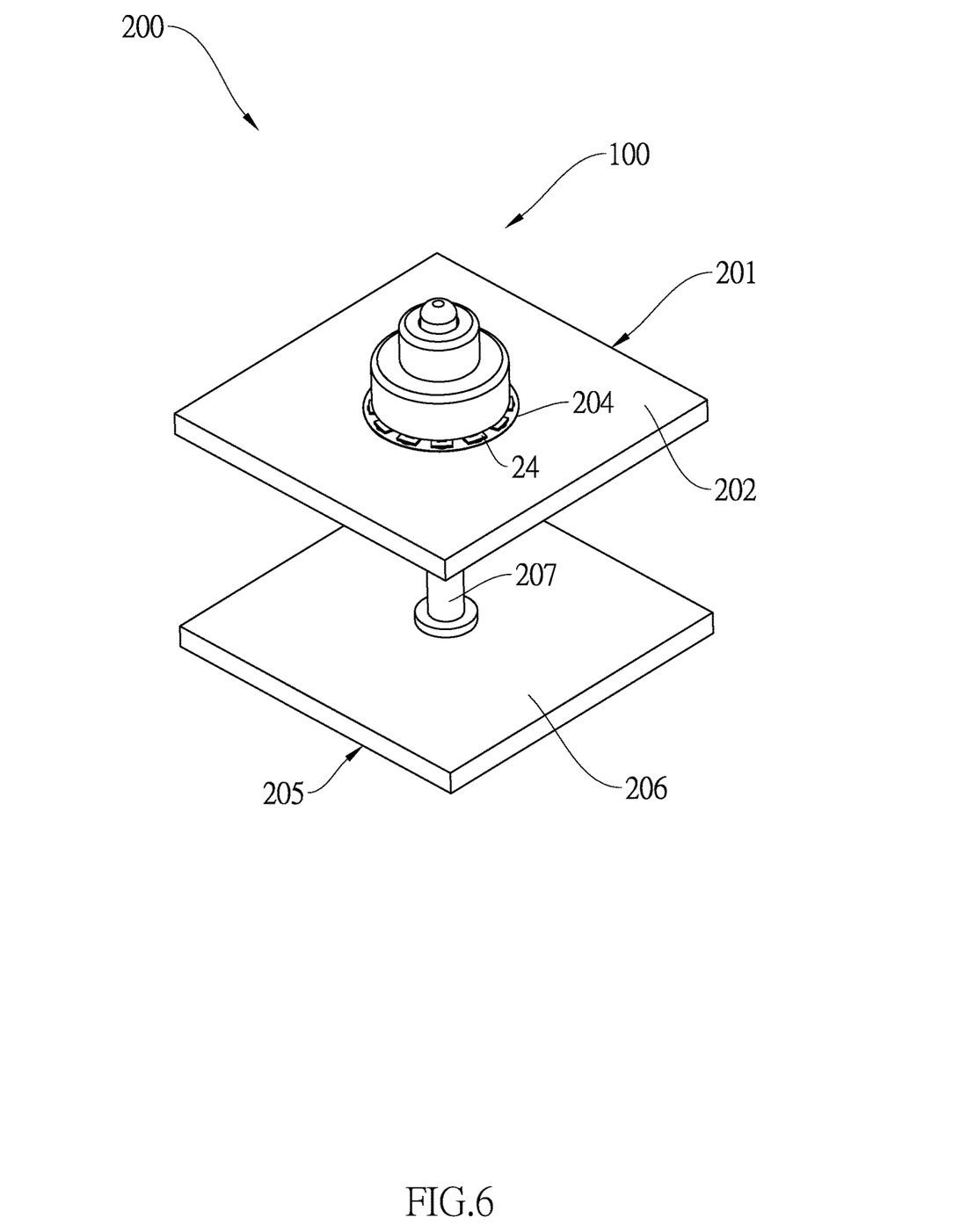
FIG. 6 is a perspective view, showing the floating electrical connector according to the embodiment of the present invention is applied to the circuit connecting structure.
Figure 7:
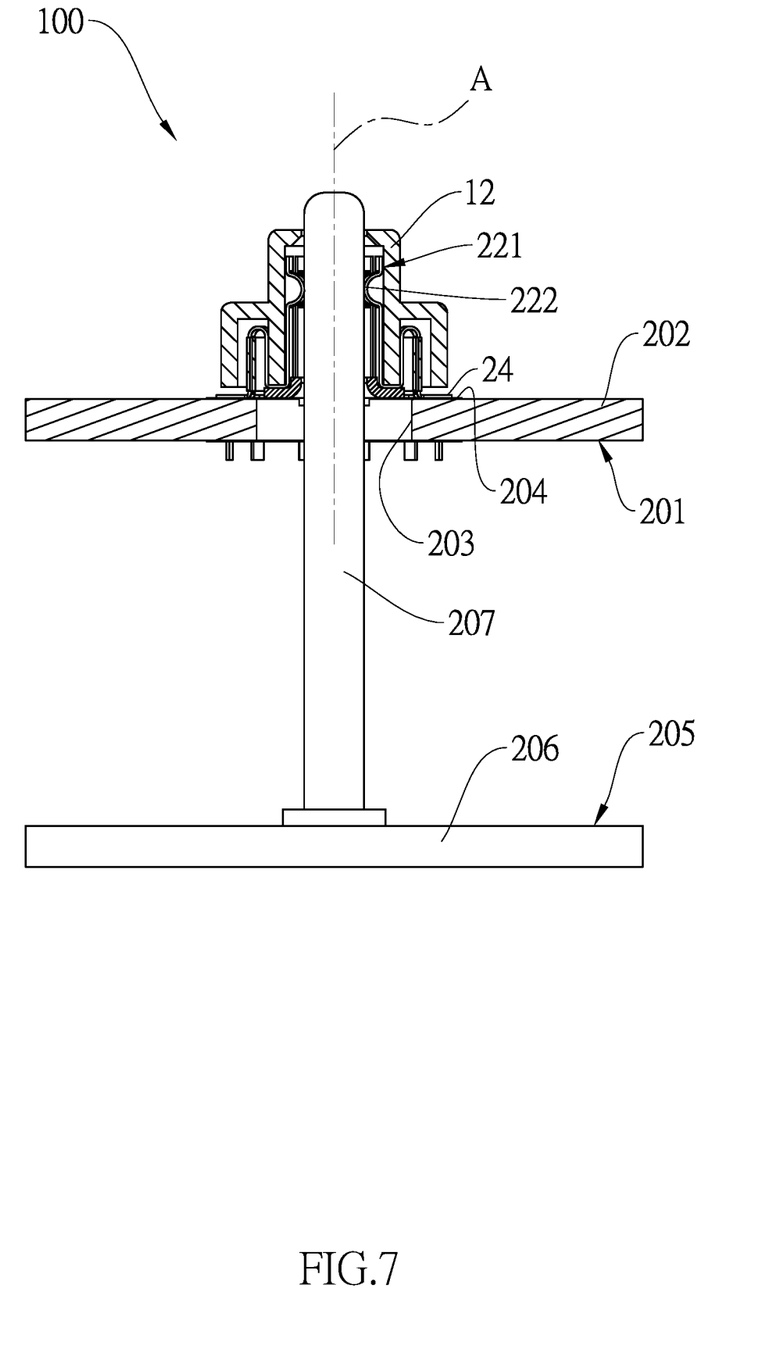
FIG. 7 is a partial sectional view, showing the floating electrical connector according to the embodiment of the present invention is applied to the circuit connecting structure.

Referring to FIG. 6 and FIG. 7, the floating electrical connector 100 is applied to a circuit connecting structure 200, wherein the circuit connecting structure 200 includes a first circuit structure 201, the floating electrical connector 100, and a second circuit structure 205. The first circuit structure 201 has a first circuit board 202, wherein the first circuit board 202 has a through hole 203 and a circuit contact 204 around the through hole 203. In the current embodiment, the circuit contact 204 is located on a top surface of the first circuit board 202. In practice, the circuit contact 204 could be disposed on a bottom surface of the first circuit board 202, or could be disposed on both of the top surface and the bottom surface of the first circuit board 202 around the through hole 203. Additionally, in practice, the first circuit board 202 could have a plurality of circuit contacts 204 located around the through hole 203 for electrically connected to the external pins 24.

The external pins 24 of the floating electrical connector 100 are electrically connected to the circuit contact 204 on the top surface around the through hole 203, so that the floating electrical connector 100 is located above the through hole 203, and the axis A passes through a center of the through hole 203. In an embodiment that the circuit contact 204 is disposed on the bottom surface around the through hole 203, the external pins 24 of the floating electrical connector 100 are electrically connected to the circuit contact 204, so that the floating electrical connector 100 is located below the through hole 203. The second circuit structure 205 is located below the first circuit structure 201 and has a second circuit board 206, wherein the second circuit board 206 is electrically connected to a conductive pin 207 which is uprightly disposed, and the conductive pin 207 passes through the through hole 203 of the first circuit board 202 to enter the tubular portion 12 of the floating electrical connector 100. In an embodiment that the floating electrical connector 100 located below the through hole 203, the conductive pin 207 passes through the tubular portion 12 of the floating electrical connector 100 first, and then passes through the through hole 203 of the first circuit board 202. During a process of inserting the conductive pin 207 into the tubular portion 12, since the inner terminal sheets 221 are supported by the inner peripheral surface of the tubular portion 12 and the electronic contacts 222 formed by the inner terminal sheets 221 are elastic, a peripheral surface of the conductive pin 207 expands the electronic contacts 222 when the conductive pin 207 being inserted, so that the conductive pin 207 could elastically abut against the electronic contacts 222 after the conductive pin 207 is inserted, allowing the second circuit structure 205 to be electrically connected to the first circuit structure 201 via the floating electrical connector 100.

Figure 8:
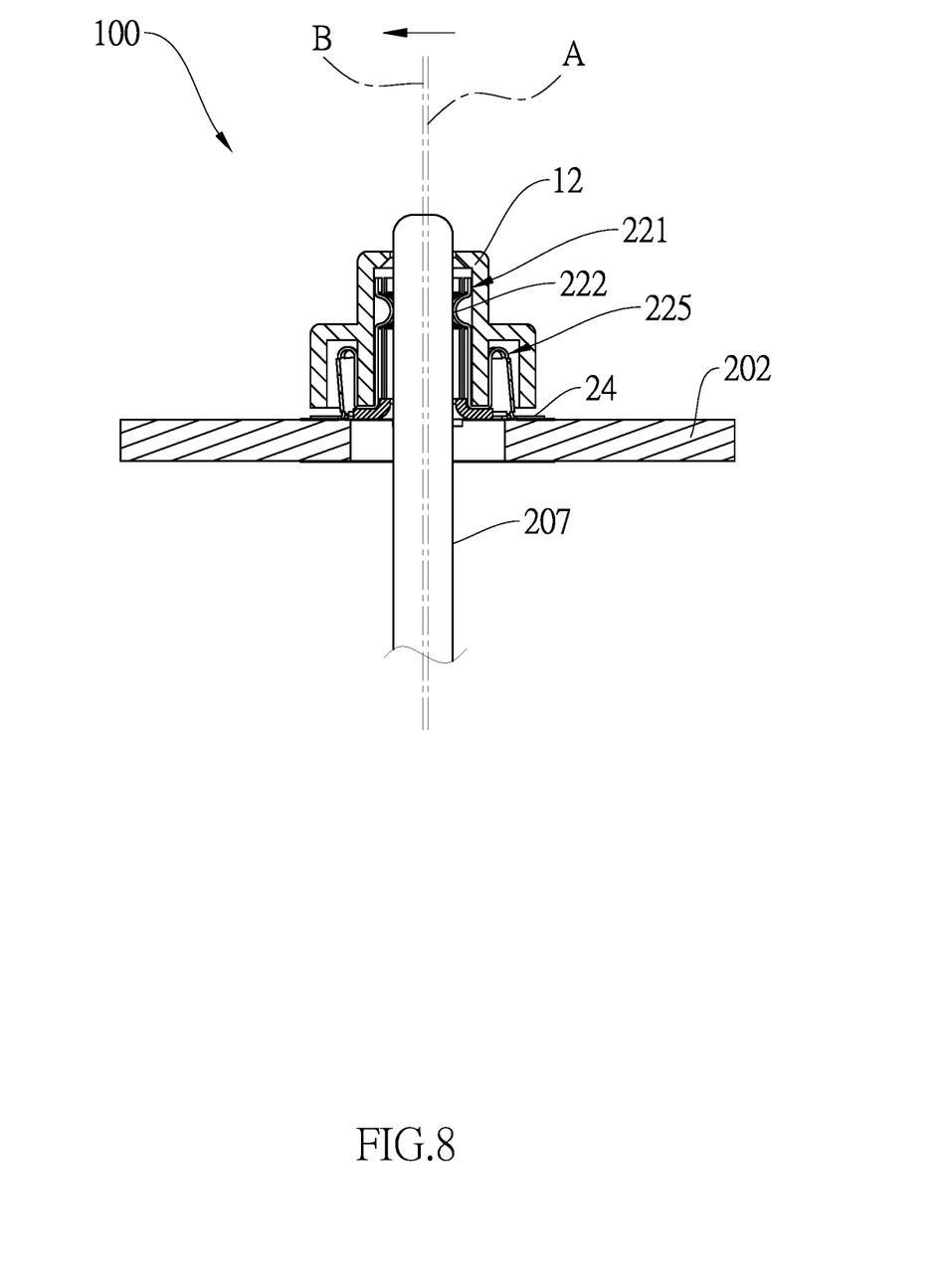
FIG. 8 is a schematic view, showing the floating electrical connector according to the embodiment of the present invention absorbs the horizontal deviation.
Figure 9:
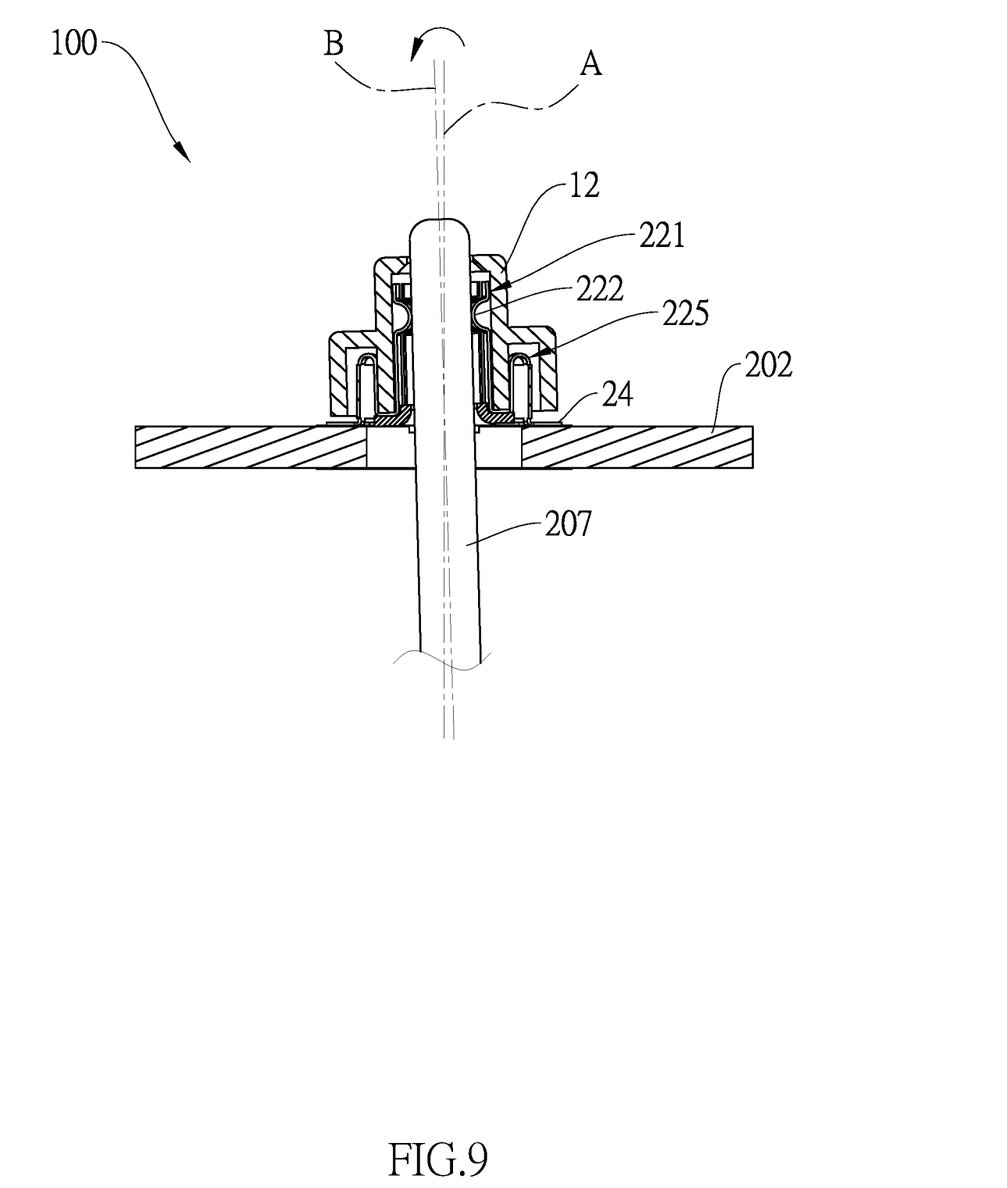
FIG. 9 is a schematic view, showing the floating electrical connector according to the embodiment of the present invention absorbs the skew deviation.

Referring to FIG. 8 and FIG. 9, since the spring structures 225 of the conductive member 20 have high deformation tolerance, the floating electrical connector 100 according to the embodiment of the present invention could adapt well to a horizontal deviation or a skew deviation when the conductive pin 207 is inserted.

Referring to FIG. 8, a situation that if the axle center B of the conductive pin 207 has a horizontal deviation from the axis A during a process of inserting the conductive pin 207 into the floating electrical connector 100 is illustrated. The spring structures 225 surround and are spaced at intervals. The external pins 24 are fixed to the first circuit board 202. The inner terminal sheet 221 is adapted to be electrically connected to the conductive pin 207. Since there are the spring structures 225 connected between the external pins 24 and the inner terminal sheet 221 in the tubular portion 12, the spring structures 225 could horizontally deform (i.e., a part of the spring structures 225 on a side could expand and a part of the spring structures 225 on another side could compress) when the conductive pin 207 has a horizontal deviation, thereby a position of the tubular portion 12 could horizontally float to adapt to the horizontal deviation of the conductive pin 207, providing a better electrical connection between the conductive pin 207 and the electronic contacts 222 when the conductive pin 207 is inserted into the tubular portion 12.

Referring to FIG. 9, a situation that if the axle center B of the conductive pin 207 has a skew deviation from the axis A during a process of inserting the conductive pin 207 into the floating electrical connector 100 is illustrated. With the spring structures 225 connected between the external pins 24 and the inner terminal sheet 221 in the tubular portion 12, the spring structures 225 could elastically deform to skew (i.e., a part of the spring structures 225 on a side could compress, and a part of the spring structures 225 on another side could expand to twist) when the conductive pin 207 has a skew deviation, thereby a position of the tubular portion 12 could skew to adapt to the skew deviation of the conductive pin 207, providing a better electrical connection between the conductive pin 207 and the electronic contacts 222 when the conductive pin 207 is inserted into the tubular portion 12. In this way, the floating electrical connector 100 of the aforementioned embodiment could improve a problem of reducing the contact area between the conductive pin and the contact spring due to the deformation of the terminal of the conventional electrical connector when the conductive pin 207 is forcibly inserted into the conventional electrical connector, and thereby improving a blackout problem when a large current passes through the circuit connecting structure 200.

Referring to FIG. 1 to FIG. 5, the detail structures of the floating electrical connector 100 according to the embodiment of the present invention are going to be described as follow, wherein the inner terminal sheet 221 of each of the floating terminals 22 has a straight section 223 and an extending section 224 connected to an end of the straight section 223. Each of the straight sections 223 enters the tubular portion 12 via a bottom end of the tubular portion 12 and abuts against the inner peripheral surface of the tubular portion 12. Each of the extending section 224 abuts against an end edge of the bottom end of the tubular portion 12, wherein the electronic contacts 222 are arranged in annular at the same height and are respectively disposed on another end of each of the straight sections 223 opposite to the extending section 224.

The housing 10 has a plurality of engaging members 121 connected to the end edge of the bottom end of the tubular portion 12, wherein each of the engaging members 121 passes between any two adjacent extending sections 224 to be engaged with a bottom ring 14, thereby each of the extending sections 224 is positioned between the end edge of the bottom end of the tubular portion 12 and the bottom ring 14. The spring structure 225 of each of the floating terminals 22 has an inner spring plate 226, a curved section 227 connected at a top end of the inner spring plate 226 and extending outward, and a connecting portion 228 connected at an outer end of the curved section 227, wherein aby two adjacent connecting portions 228 are connected to form a connecting structure 229 which is annular and has a top edge and a bottom edge. The outer end of each of the curved sections 227 is connected to the top edge of the connecting structure 229, and the external pins 24 are connected to the bottom edge of the connecting structure 229. The connecting structure 229 is centered on the axis A and is a structure in which the floating terminals 22 are partially connected.

The connecting structure 229 is an elongated plate that is curved to be annular and has a seam 2291 on a side. In this way, the conductive member 20 of the floating electrical connector 100 could be manufactured by stamping a piece of metal plate to form the external pins 24, the connecting structure 229, and the floating terminals 22 partially connected to the connecting structure 229, and then winding the elongated plate of the connecting structure 229 into a circular ring, and welding and joining the seam 2291 by spot welding.

For protecting the spring structures 225, a periphery of the housing 10 has a cover 16 which is circular and is connected to a middle portion of an outer peripheral surface of the tubular portion 12, wherein the cover 16 extends to surround and cover a pan of the outer peripheral surface of the tubular portion 12 to form an annular receiving groove 161 inside the cover 16 between the tubular portion 12 and the cover 16. An opening of the receiving groove 161 is located around the end edge of the bottom end of the tubular portion 12. The spring structures 225 enter and are received in the receiving groove 161. A width of the receiving groove 161 in a radial direction thereof is greater than a width of the spring structures 225 in the radial direction of the receiving groove 161, thereby providing an expansion space or a deformation space to each of the spring structures 225.

Figure 10:
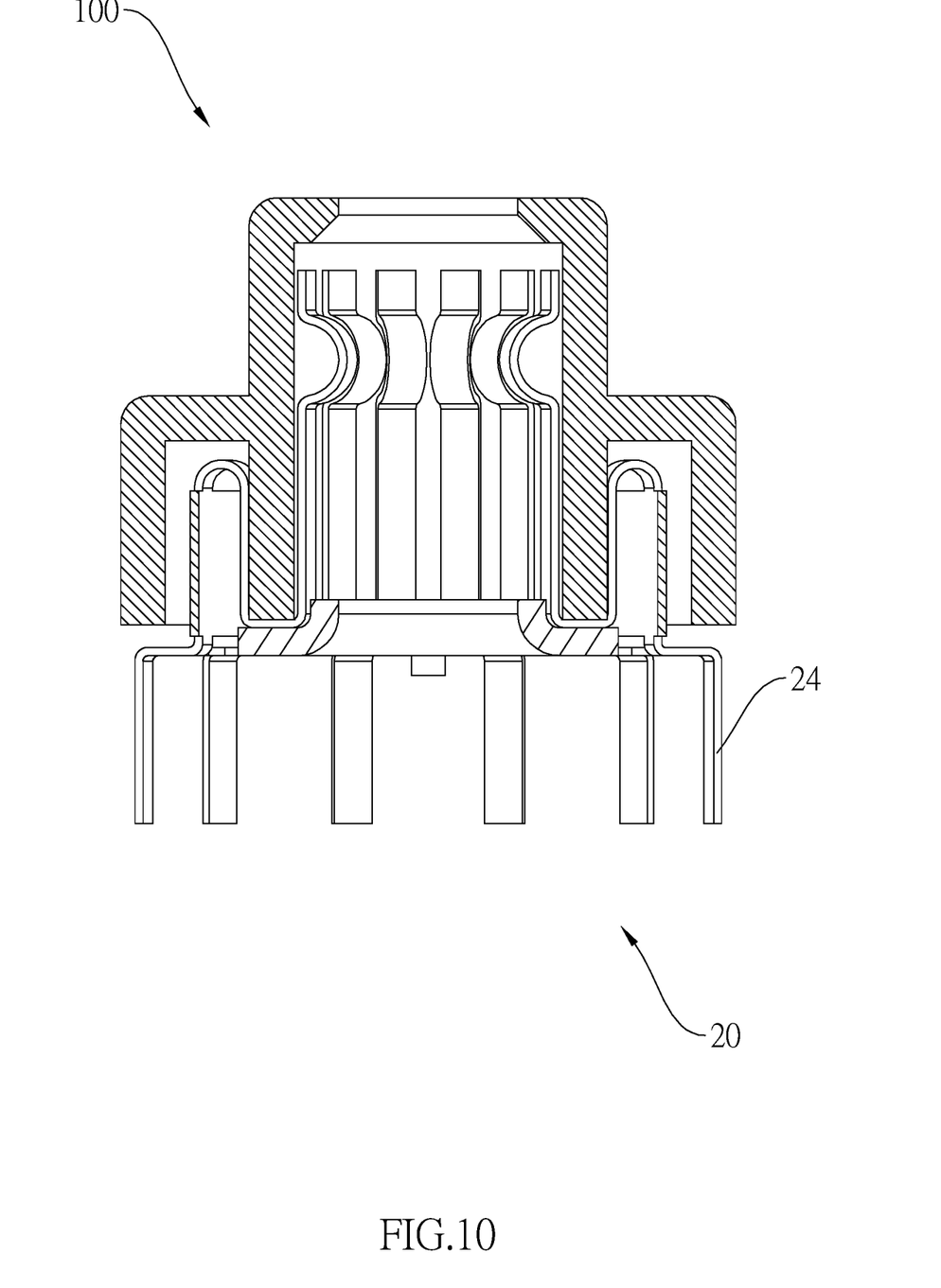
FIG. 10 is a sectional view, showing the floating electrical connector according to another embodiment of the present invention.

A floating electrical connector 100 according to another embodiment of the present invention is illustrated in FIG. 10, which has almost the same structures as that of the aforementioned embodiment, except that replace the external pins 24 of the conductive member 20 in a pad form to a L-shaped plate, wherein each of the external pins 24 which is in the form of L-shaped plate pass through a hole on the first circuit board 202 to be fixed by welding. The floating electrical connector 100 of the current embodiment could also be applied to the circuit connecting structure 200 for being inserted by a conductive pin 207 and to build an electrical connection between circuit structures, and could absorb an aligning horizontal deviation and an aligning skew deviation as well.

It must be pointed out that the embodiments described above are only some preferred embodiments of the present invention. All equivalent structures which employ the concepts disclosed in this specification and the appended claims should fall within the scope of the present invention.

What is claimed is:

1. A floating electrical connector, comprising: a housing having a tubular portion, wherein an axis is defined in a center of the tubular portion; and a conductive member comprising a plurality of floating terminals and a plurality of external pins, wherein the floating terminals are arranged at intervals around the axis and are partially connected; each of the floating terminals has an inner terminal sheet on an inner side and a spring structure on an outer side; each of the spring structures is connected to one of the inner terminal sheets; at least a portion of the inner terminal sheet is inserted into the tubular portion and arranged along an inner peripheral surface of the tubular portion; the portion of each of the inner terminal sheets located in the tubular portion has an electronic contact bulging inward; the external pins are electrically connected to the floating terminals; wherein the connecting structure is formed by winding an elongated plate into a circular ring and has a seam on a side; and wherein each of the spring structures has an inner spring plate, a curved section connected at a top end of the inner spring plate and extending outward, and a connecting portion connected at an outer end of the curved section; the connecting portions are connected to form a connecting structure which is annular and is centered on the axis.

2. The floating electrical connector as claimed in claim 1, wherein the floating terminals are partially connected to form a connecting structure which is annular, the connecting structure is centered on the axis.

3. The floating electrical connector as claimed in claim 1, wherein the connecting structure has a top edge and a bottom edge; the outer end of the curved section of each of the spring structures is connected to the top edge of the connecting structure; the external pins are respectively connected to the bottom edge of the connecting structure.

4. The floating electrical connector as claimed in claim 1, wherein the connecting structure is formed by winding an elongated plate into a circular ring and has a seam on a side.

5. The floating electrical connector as claimed in claim 4, wherein each of the inner terminal sheets has a straight section and an extending section connected to the straight section; each of the straight sections enters the tubular portion, and each of the extending sections abuts against an end edge of the tubular portion; the housing has a plurality of engaging members connected to the end edge of the tubular portion; each of the engaging members passes between two of the extending sections which are adjacent to be engaged with a bottom ring, so that each of the extending section is positioned between the end edge of the tubular portion and the bottom ring.

6. The floating electrical connector as claimed in claim 5, wherein the housing has a cover which is circular and is connected to an outer peripheral surface of the tubular portion and extends to form an annular receiving groove inside the cover, the spring structures are received in the receiving groove; a width of the receiving groove in a radial direction of the receiving groove is greater than a width of each of the spring structures in the radial direction of the receiving groove.

7. The floating electrical connector as claimed in claim 6, wherein each of the external pins is a pad or a L-shaped plate.

8. A circuit connecting structure, comprising:
a first circuit structure having a first circuit board having a through hole;

a floating electrical connector as claimed in claim 1, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

9. A circuit connecting structure, comprising:

a first circuit structure having a first circuit board having a through hole;

a floating electrical connector as claimed in claim 2, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

10. A circuit connecting structure, comprising:

a first circuit structure having a first circuit board having a through hole;

a floating electrical connector as claimed in claim 5, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

11. A circuit connecting structure, comprising:

a first circuit structure having a first circuit board having a through hole;

a floating electrical connector as claimed in claim 6, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

12. A circuit connecting structure, comprising:

a first circuit structure having a first circuit board having a through hole;

a floating electrical connector as claimed in claim 5, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

13. A circuit connecting structure, comprising:

a first circuit structure having a first circuit board having a through hole;

a floating electrical connector as claimed in claim 6, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

14. A circuit connecting structure, comprising:

a first circuit structure having a first circuit board having a through hole;

a floating electrical connector as claimed in claim 7, wherein the external pins of the floating electrical connector are electrically connected to a portion of the first circuit board around the through hole, and the axis passes through a center of the through hole; and a second circuit structure having a second circuit board, wherein the second circuit board is electrically engaged with a conductive pin; the conductive pin is inserted into the tubular portion of the floating electrical connector to be in contact with the electronic contacts, and the conductive pin passes through the through hole of the first circuit board, so that the second circuit structure is electrically connected to the first circuit structure via the floating electrical connector.

\* \* \* \* \*